United States Patent [19]
Kim

[11] Patent Number: 5,831,305
[45] Date of Patent: Nov. 3, 1998

[54] CMOS DEVICES HAVING MINIMIZED DRAIN CONTACT AREA

[75] Inventor: Jae Kap Kim, Kyoungki-do, Rep. of Korea

[73] Assignee: Hyundai Electronics Industries Co., Ltd., Kyoungki-do, Rep. of Korea

[21] Appl. No.: 689,513

[22] Filed: Aug. 9, 1996

Related U.S. Application Data

[62] Division of Ser. No. 375,551, Jan. 19, 1995, Pat. No. 5,573,969.

[30] Foreign Application Priority Data

Jan. 19, 1994 [KR] Rep. of Korea .......................... 94-974

[51] Int. Cl.⁶ ........................... H01L 29/76; H01L 29/94; H01L 23/62
[52] U.S. Cl. .......................... 257/338; 257/344; 257/351; 257/357; 257/369; 257/371; 257/374; 437/56; 437/57; 437/58; 437/67
[58] Field of Search ..................................... 257/338, 351, 257/369, 371, 374, 314, 357; 437/56, 57, 58, 67

[56] References Cited

U.S. PATENT DOCUMENTS

| | | |
|---|---|---|
| 4,729,964 | 3/1988 | Natsuaki et al. . |
| 4,766,090 | 8/1988 | Coquin et al. . |
| 4,927,777 | 5/1990 | Hsu et al. . |
| 4,945,070 | 7/1990 | Hsu . |
| 4,980,306 | 12/1990 | Shimbo . |
| 5,015,594 | 5/1991 | Chu et al. . |
| 5,137,837 | 8/1992 | Chang et al. . |
| 5,362,981 | 11/1994 | Sato et al. ................................ 257/371 |
| 5,384,280 | 1/1995 | Aoki et al. . |

FOREIGN PATENT DOCUMENTS

| | | |
|---|---|---|
| 59-155943 | 9/1984 | Japan . |
| 59-188936 | 10/1984 | Japan . |
| 60-38861 | 2/1985 | Japan . |
| 60-170251 | 9/1985 | Japan . |
| 60-171760 | 9/1985 | Japan . |
| 62-269336 | 11/1987 | Japan . |
| 63-116445 | 5/1988 | Japan . |
| 1-125971 | 5/1989 | Japan . |
| 6-69434 | 3/1994 | Japan . |

*Primary Examiner*—Valencia Martin Wallace
*Attorney, Agent, or Firm*—Morgan & Finnegan, LLP

[57] ABSTRACT

There are disclosed a semiconductor device and a method for fabrication thereof. The semiconductor device comprises an insulating film for well isolation which electrically insulates N-well from P-well, the drain electrode of PMOS and the drain electrode of NMOS being adjacent to the trench fox well isolation, and a conductive wire filling one contact hole which interconnects the drain electrodes of N-well with those of P-well. The semiconductor device is very reduced in size, and thus, high integration thereof can be achieved.

11 Claims, 4 Drawing Sheets

CMOS DEVICES HAVING MINIMIZED DRAIN CONTACT AREA

This is a divisional of application Ser. No. 08/375,551 filed Jan. 19, 1995, U.S. Pat. No. 5,573,969.

BACKGROUND OF THE INVENTION

1. Field of the Invention

The present invention relates, in general, to a semiconductor device and, more particularly, to a semiconductor device reduced in connecting area in which a drain electrode of PMOS is connected with a drain electrode of NMOS, and a method for fabrication thereof.

2. Description of the Prior Art

High integration of a semiconductor device is accomplished with a great diminution in the area occupied by a unit cell. An area in a semiconductor device for interconnecting a drain of PMOS with a drain of NMOS is generally known to be the structure which occupies the largest area in a semiconductor device. This interconnection is typically accomplished through a contact hole with a conductive wire.

In order to better understand the background of the present invention, the conventional techniques for fabrication of a semiconductor device will be described with reference to some drawings.

FIG. 1 is a circuit diagram showing a semiconductor device widely used in an integrated circuit. As shown in this figure, $V_{DD}$ is connected with a source electrode of PMOS; a drain electrode of PMOS with a drain electrode of NMOS; a source electrode of NMOS with $V_{SS}$. In this circuit diagram, depending upon the voltage applied to the gate electrode ($V_{in}$) of PMOS or NMOS, the output voltage ($V_{out}$) of PMOS or NMOS is determined.

FIG. 2 shows a semiconductor device of FIG. 1 fabricated on a semiconductor substrate in a conventional technique. As shown in this figure, a semiconductor substrate 1 is provided with an N-well 10 and a P-well 20. An element isolation insulating layer 2 is formed on the- boundary between the N-well 10 and the P-well 20. Then, a PMOS transistor consisting of a gate oxide 3, a gate electrode 4, a source electrode ISA, and a drain electrode 15B is fabricated on an active region of the N-well 10. Likewise, an NMOS transistor consisting of a gate oxide 3, a gate electrode 4, a source electrode 25A, and a drain electrode 25B is fabricated on an active region of the P-well 20. Thereafter, a blanket insulating layer is deposited over the resulting structure. Two contact holes are formed exposing the drain electrode 15B of PMOS and the drain electrode 25B of NMOS, respectively. In order to interconnect the drain electrode 15B of PMOS with the drain electrode 25B of NMOS, a conductive wire is formed filling the two contact holes.

However, although such prior art techniques, that is, the element isolation layer between the N-well and the P-well and the contact holes exposing the drain electrodes of the PMOS and NMOS, can reduce the size of a semiconductor device to some degree, it is virtually impossible to achieve a very high integration of a semiconductor device through such prior art techniques.

SUMMARY OF THE INVENTION

Therefore, an object of the present invention is to overcome the above problems encountered in prior art and to provide a semiconductor device reduced in unit area.

Another object of the present invention is to provide a method for fabricating the semiconductor device.

In accordance with an aspect of the present invention, there is provided a semiconductor device comprising: an N-well and a P-well, both formed in a semiconductor device; a trench for well isolation which is formed at a boundary between said N-well and said P-well and deeper than said wells; a PMOS and an NMOS which are formed at said N-well and said P-well, respectively, the drain electrodes of said PHOS and NMOS being formed adjacent to said trench; an insulating film for well isolation filling a portion of said trench; an interlayer insulating layer provided with a contact hole located over said trench and an area of said drain electrodes; and a conductive wire filling said contact hole and the other portion of said trench, completely, said drain electrodes being interconnected with each other through said conductive wire.

In accordance with another aspect of the present invention, there is provided a method for the fabrication of a semiconductor device, comprising the steps of: forming a trench for well isolation in a predetermined area of a semiconductor substrate; filling said trench for well isolation with an isolating film completely; forming an N-well and a P-well in the semiconductor substrate, said trench for well isolation being between said N-well and said P-well; forming in sequence a gate oxide and a gate electrode on each of the N-well and the P-well; forming a $P^+$ type source electrode and a $P^+$ type drain electrode in said N-well and an $N^+$ type source electrode and an $N^+$ type drain electrode in said P-well, said drain electrodes being adjacent to said trench; forming a blanket interlayer insulating layer over the resulting structure; selectively etching said interlayer insulating layer, to form a contact hole which exposes said drain electrodes adjacent to said trench and said insulating film in said trench; and filling a conductive wire in said contact hole to interconnect said drain electrodes with each other.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
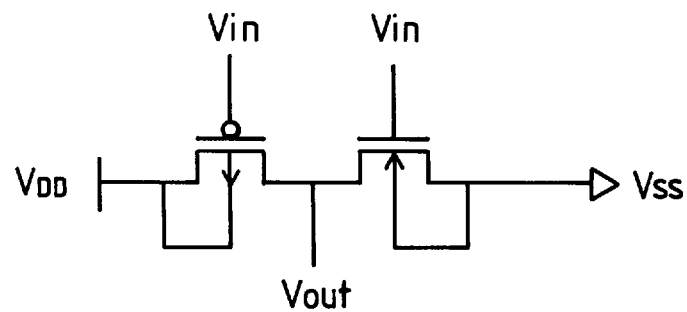
FIG. 1 is a circuit diagram of a semiconductor device showing the interconnection of a drain electrode of PMOS with a drain electrode of NMOS.
Figure 2:
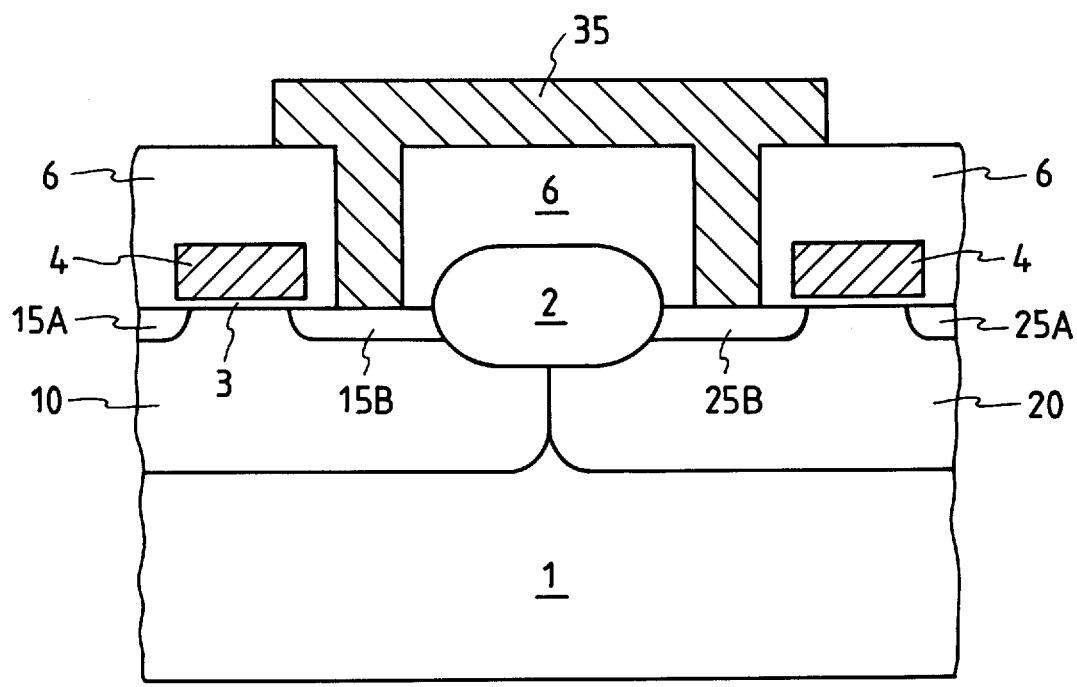
FIG. 2 is a schematic cross sectional view showing a conventional semiconductor device of FIG. 1.

The application of the preferred embodiments of the present invention is best understood with reference to the accompanying drawings, wherein like reference numerals are used fox like and corresponding parts, respectively.

FIG. 3 shows the preferred process steps for fabricating the semiconductor device of FIG. 1 on a semiconductor substrate, according to the present invention. These preferred process steps will be described in great detail in connection with FIGS. 3A through 3E.

Figure 3A:
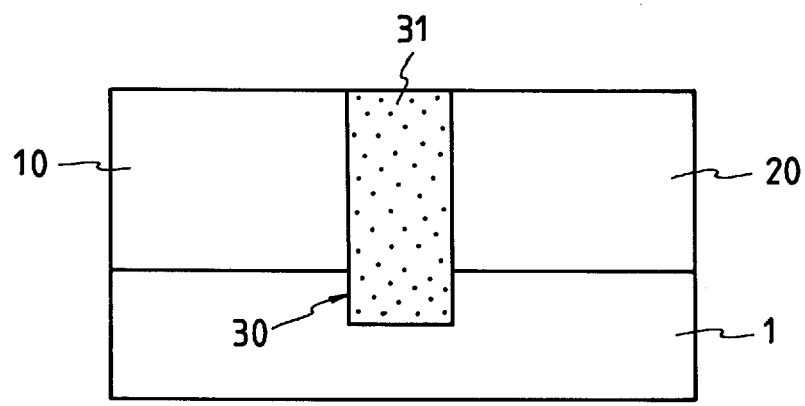
FIGS. 3A through 3E are schematic cross sectional views illustrating a method for fabricating a semiconductor device of FIG. 1, according to the present invention.

First, as shown in FIG. 3A, there are formed an N-well 10 and a P-well in a semiconductor substrate 1. For this, a trench 30 for well isolation which is, for example, about 0.3 to 3.0 $\mu$m wide and, for example, about 1.5 to 10 $\mu$m deep is first formed in a predetermined area of the semiconductor substrate 1 and filled with an insulating film fox well isolation 31, for example, an oxide, followed by subsequential ion implantation of dopants into the substrate. Upon the implantation, an N-well mask (not shown) is utilized for formation of the N-well 10 while a P-well mask (not shown) is utilized for the P-well 20. As a result, the trench 30 for well isolation is between the N-well 10 and the P-well.

Figure 3B:
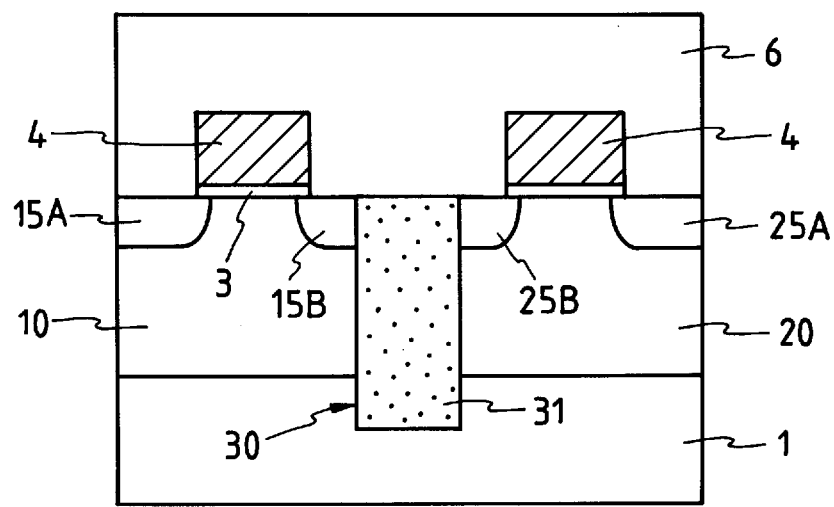

FIG. 3B is a cross section after a gate oxide 3 and a gate electrode 4 are formed over the N-well 10 and over the P-well 20 subsequent to formation of an element isolation film (not shown) on a predetermined element isolation region without the trench 30, and $P^+$ impurities and $N^+$ impurities are implanted into the N-well 10 and the P-well 20, respectively, to form a source electrode 15A and a drain electrode 15B in the N-well and a source electrode 25A and a drain electrode 25B in the P-well, followed by formation of a blanket interlayer insulating layer 6, for example, boro-phosphosilicate-glass (BPSG), over the resulting structure.

Figure 3C:
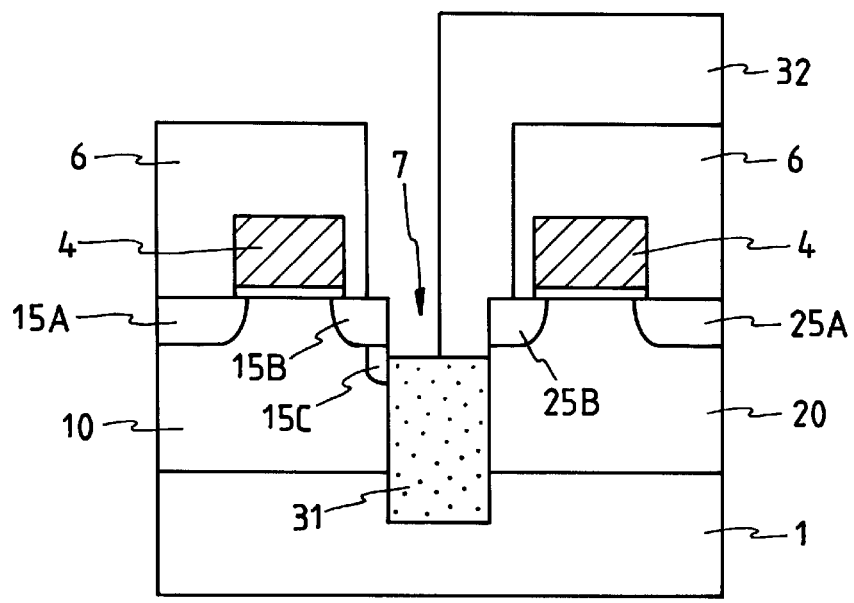

Next, with reference to FIG. 3C, the interlayer insulating layer 6 is subjected to etching by use of a contact mask (not shown), to form a contact hole 7 which exposes an area of the drain electrode 15B of PMOS, an area of drain electrode 25B of NMOS and the insulating film for well isolation. By this etching, the insulating film 31 of the trench is overetched, to expose the side surfaces of the drain electrodes 15B, 25B and an area of the wells adjacent to the trench. Subsequently, a first mask 32 is formed over the interlayer insulating layer 6 above the NMOS in such a way that it overlaps with the overetched insulating film 31. Using this mask, $P^+$ impurities ate implanted to form a drain electrode 15C at one side of the contact hole 7. As will be further described, this formed drain electrode 15C contributes to enlarging the contact area with a conductive material in addition to preventing the conductive material from being brought into direct contact with the P-well and N-well.

Figure 3D:
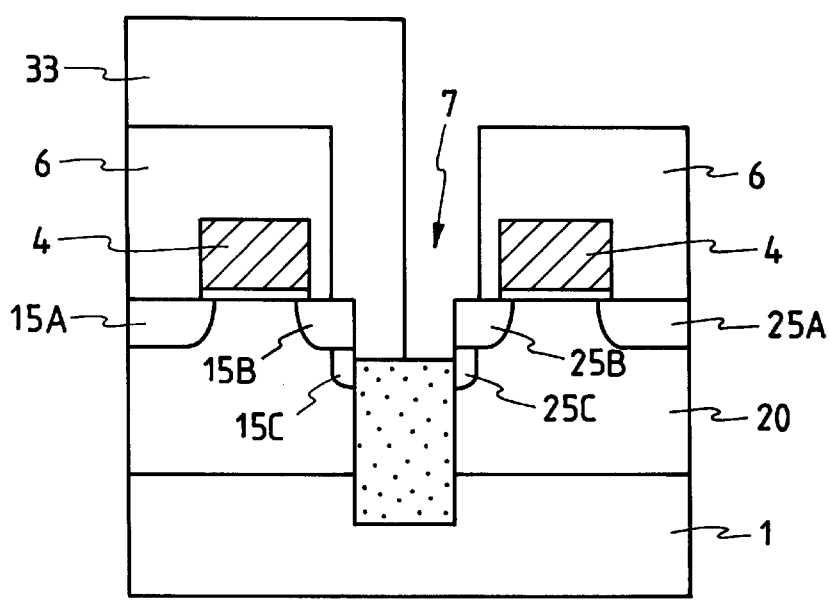

FIG. 3D is a cross section after a second mask 32 is formed over the interlayer insulating layer 6 above the PMOS in such a way that it overlaps with the overetched insulating film 31, subsequent to removal of the first mask 31, followed by implantation of $N^+$ impurities, to form a drain electrode 25C at the other side of the contact hole 7.

Figure 3E:
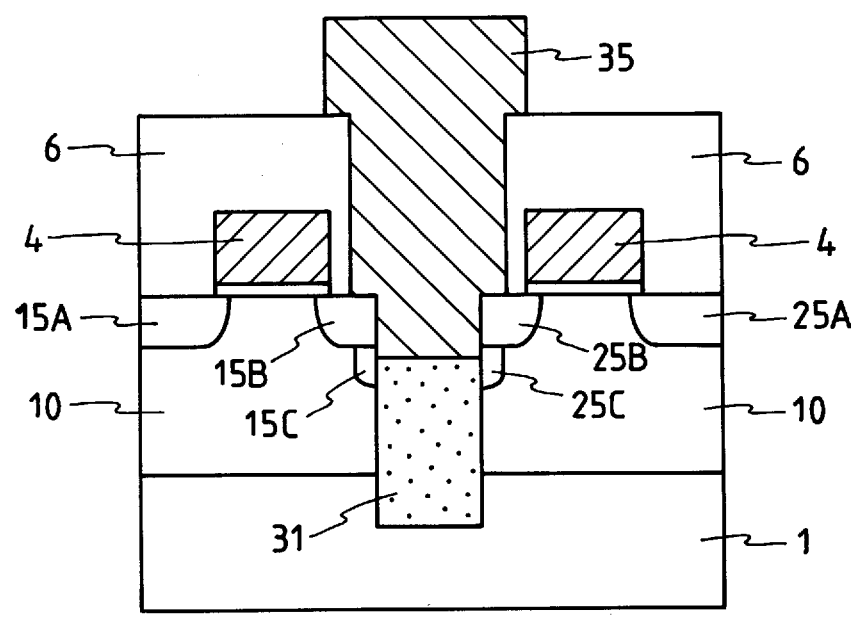

Finally, FIG. 3E is a cross section after the second mask 33 is removed, followed by filling a conductive wire 35 in the resulting contact hole 7. In this state, the drain electrodes 15B, 25B are connected with each other by the one conductive wire 35, while the N-well 10 and the. P-well 20 are electrically insulated from each other by the insulating film for well isolation.

As described hereinbefore, the insulating film for well isolation electrically insulates N-well from P-well, the drain electrode of PMOS and the drain electrode of NMOS being adjacent to the trench for well isolations and the drain electrodes are connected with each other by one conductive wire filling the one contact hole, thereby reducing the size of a semiconductor device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A semiconductor device comprising:
    an N-well and a P-well, both formed in a semiconductor substrate;
    a trench for well isolation which is formed at a boundary between said N-well and said P-well and deeper than said wells;
    a PMOS device and an NMOS device which are formed at said N-well and said P-well, respectively, the drain electrodes of said PMOS and NMOS being formed adjacent to said trench;
    an insulating film for well isolation filling a portion of said trench;
    an interlayer insulating layer provided with a contact hole located over said trench and an area of said drain electrodes; and
    a conductive wire completely filling said contact hole and the other portion of said trench, said drain electrodes being interconnected with each other through said conductive wire.

2. A semiconductor device in accordance with claim 1, wherein said drain electrodes are formed extending along the respective side walls of said trench.

3. A semiconductor device in accordance with claim 1, wherein said semiconductor substrate is of P type or N type.

4. A semiconductor device in accordance with claim 1, wherein said trench for well isolation has a width of about 0.3 to 3.0 $\mu$m.

5. A semiconductor device in accordance with claim 1, wherein said trench for well isolation has a depth of about 1.5 to 10 $\mu$m.

6. A semiconductor device in accordance with claim 1, wherein said insulating film fox well isolation is an oxide.

7. A semiconductor device in accordance with claim 1, wherein said interlayer insulating layer is boro-phosphosilicate-glass.

8. The semiconductor device of claim 1 further comprising drain electrode, extensions extending beneath the drain for enlarging-a contact area for the conductive wire.

9. The semiconductor device of claim 1 wherein the drain electrodes are exposed in the trench for enlarging a contact area for the conductive wire.

10. The semiconductor device of claim 1 wherein the conductive wire contacts the drain electrode at the surface and along the sides thereof.

11. The semiconductor device of claim 1 wherein the conductive wire contacts the drain extensions.

* * * * *